United States Patent [19]

Kikuiri

[11] Patent Number: 5,323,712
[45] Date of Patent: Jun. 28, 1994

[54] TABLE MOVING APPARATUS

[75] Inventor: Nobutaka Kikuiri, Kawasaki, Japan

[73] Assignee: Kabushiki Kaisha Toshiba, Kawasaki, Japan

[21] Appl. No.: 234,679

[22] Filed: Aug. 22, 1988

[30] Foreign Application Priority Data

Aug. 26, 1987 [JP] Japan ................ 62-211603

[51] Int. Cl.$^5$ ............................................ A47B 85/00
[52] U.S. Cl. ...................... 108/20; 108/138; 108/145; 74/479 R; 359/393
[58] Field of Search ............ 108/144, 145, 143, 147, 108/148, 138, 20; 74/479, 519; 248/186, 184, 179; 269/21; 359/393, 896; 250/442.1

[56] References Cited

U.S. PATENT DOCUMENTS

| 735,518 | 8/1903 | Hussey | 74/519 |
|---|---|---|---|
| 3,097,886 | 7/1963 | Small | 108/7 |
| 3,407,018 | 10/1968 | Miller | 359/896 |

FOREIGN PATENT DOCUMENTS 2748101 8/1989 Fed. Rep. of Germany.
58-73117 5/1983 Japan.
58-207628 12/1983 Japan.

Primary Examiner—Kenneth J. Dorner
Assistant Examiner—Gerald A. Anderson
Attorney, Agent, or Firm—Oblon, Spivak, McClelland, Maier & Neustadt

[57] ABSTRACT

A table moving apparatus includes a reference table, a object movable holizontally to generate a driving force acting holizontally, a lever member receiving the driving force to swing round a fulcrum and change the driving force to a vertical force, and a movable table receiving the vertical force to move vertically. The height of movable table on the reference table can be made relatively low. Pitching and rolling errors can be reduced. When the ratio of the lever member is of the reduction type, the resolution of the movable table can be made high or good. When the ratio of the lever member is of the enlargement type, the movable range of the movable table can be made large.

16 Claims, 13 Drawing Sheets

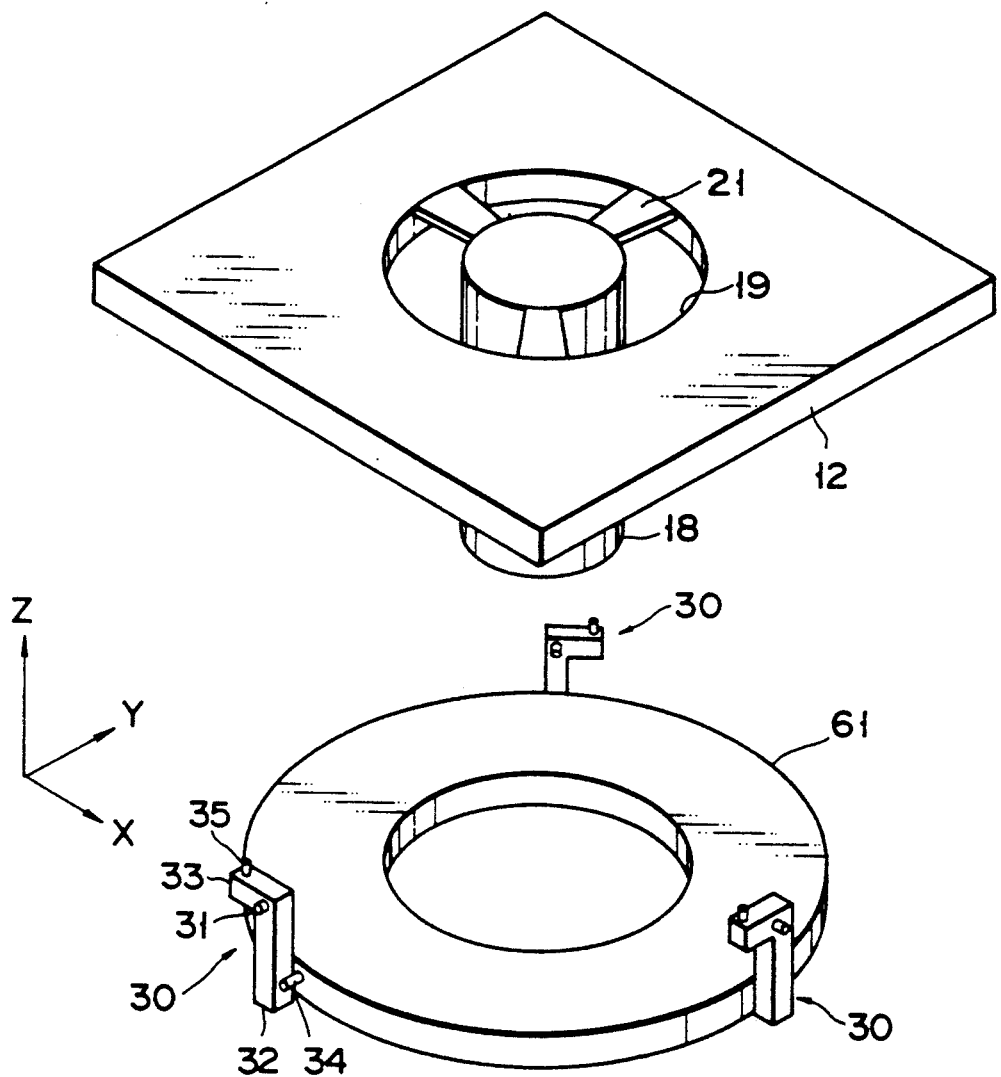
F I G. 13

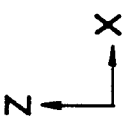
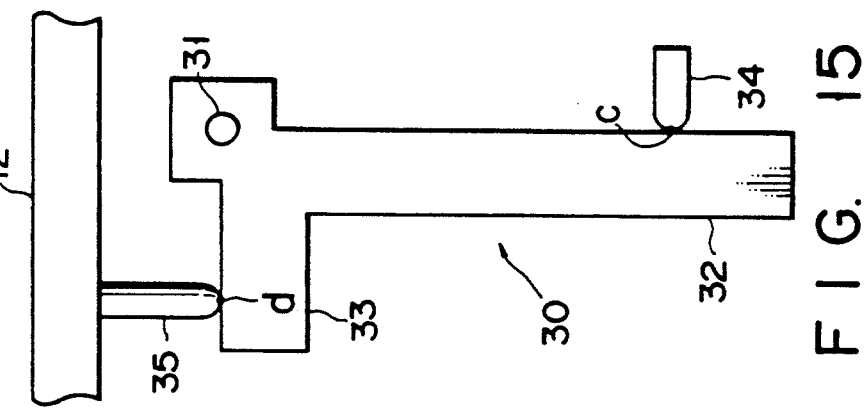
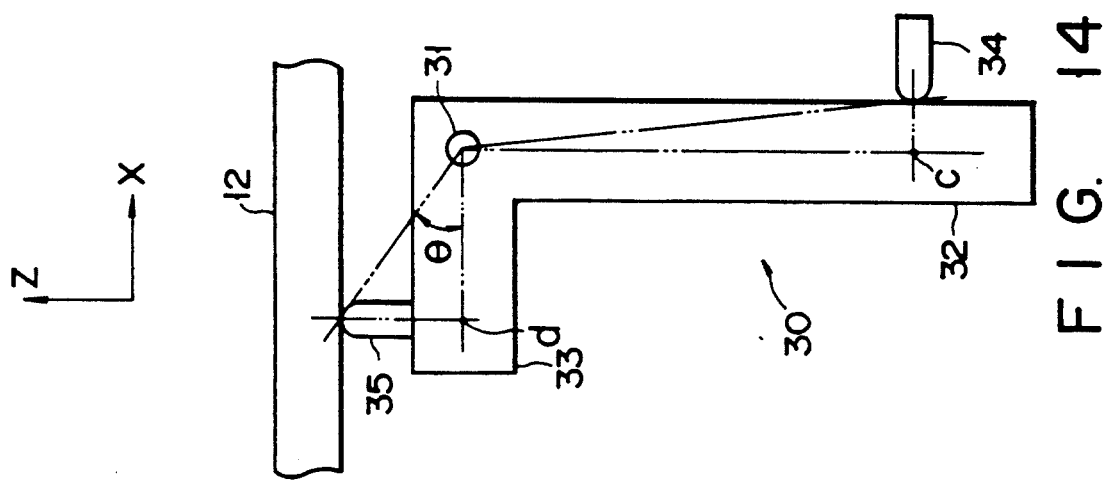

TABLE MOVING APPARATUS

BACKGROUND OF THE INVENTION

1. Field of the Invention

The present invention relates to a table moving apparatus for use with the semiconductor manufacturing or super precision processing apparatus and more particularly, it relates to a table moving apparatus including a table having a plane kept horizontal and movable in the vertical direction.

2. Description of the Related Art

A circuit pattern formed on the mask (or reticule) is projected and exposed on wafers through the projection lens in the course of manufacturing semiconductors. In order to accurately project the circuit pattern on wafers, it is needed that the table on which the wafers are chucked is positioned at a predetermined position with high accuracy. More specifically, the table moving apparatus has X, Y and Z tables 1, 2 and 3 which move in directions X, Y and Z, respectively, as shown in FIG. 1, for the purpose of positioning the wafer table (not shown) in the horizontal direction (or directions X and Y which are perpendicular to each other) and in the vertical direction (or direction Z). Z table 3 is mounted on Y table 2 and the wafer table (not shown) is mounted on Z table 3.

Z table is moved relative to Y table in direction Z by the Z table moving mechanism which will be described later. Ring-shaped member 4 which encloses axial line Z and rotates round it is mounted on Y table 2. Three wedge-like blocks 5 each having a tapered face are fixed on the upper horizontal face of ring-shaped member 4 with same interval interposed between the adjacent ones in the circumferential direction of member 4. Bearing ball 6 is arranged on the tapered face of each of wedge-like blocks 5 and Z table 3 is mounted on these bearing balls 6. When ring-shaped member 4 rotates round axial line Z to move wedge-like blocks 5 in the horizontal direction, therefore, balls 6 slide up and down on their respective tapered faces. Z table 3 is thus moved in the vertical direction or in direction Z.

In the case of the Z table moving mechanism shown in FIG. 1, ring-shaped member 4, wedge-like blocks 5 and ball bearings 6 are mounted in this order on Y table 2. Z table 3 on Y table 2 is thus made elevated relatively high. This is a first problem. The more elevated Z table 3, the greater the inertia with which X table 1 moves in direction X, or Y table 2 moves in direction Y. The greater this inertia, the more difficult it will be to position Z table 3 accurately in respect to both direction X and direction Y.

That face of Z table 3 on which something like the wafer is placed is essentially kept horizontal. When this face of Z table 3 is slanted from the horizontal plane, therefore, it is deemed that error is caused. In other words, when this face of Z table 3 is slanted from the horizontal plane and swung round axial line X, it is deemed that pitching error is caused, while when it is swung round axial line Y, it is deemed that rolling error is caused. When these errors are caused, the following disadvantage arises. When that face of Z table 3 on which something like the wafer is mounted is located at an exact position and kept horizontal, the projection lens can be focused all over the wafer on the face of Z table 3, When the face of Z table 3 is located at the exact position but not kept horizontal and slanted from the horizontal plane, however, the projection lens can be focused not all over the wafer but only onto a part thereof. As the result, the circuit pattern on the mask cannot be accurately projected and exposed on the remaining part of the wafer on which the projection lens cannot be focused.

It is difficult in the case of the Z table moving mechanism shown in FIG. 1 that the tapered face of the wedge-like block is processed with high accuracy. When this tapered face is neither excellent in its flatness nor formed to have such exact an angle as previously determined, Z table cannot be move in accordance with the movement of ring-shaped member. When the flatness and angle of the tapered face of one wedge-like block is different from those of the other two, for example, Z table is moved up and down, slanting from the horizontal plane, and pitching or rolling error is thus caused. This is a second problem.

The term "resolution" will be used in this specification. An object can move every 10 μm but another object can move only every 1000 μm. The former which can move delicately has high or good resolution, while the latter which can move roughly has low or bad resolution. Heedless to say, positioning can be achieved with high accuracy in the case of the former and it can be achieved with low accuracy in the case of the latter.

When the tapered surface is not sufficiently smooth, or when the vertical movement of the bearing balls 6 is not proportional to that of the wedge-likes blocks 6, balls 6 cannot move but in a low resolution.

As the result, the resolution of Z table is low or bad and the accuracy of its positioning is low. This is a third problem.

Another Z table moving mechanism is intended to tilt Z table so as to correct the tilt of that face of Z table on which something like the wafer is mounted. As shown in FIG. 2, lift means 7 is interposed between ring-shaped member 4 and each of wedge-like blocks 5. When one of lift means 7 is driven, therefore, Z table 3 is lifted at one of those points thereof where Z table 3 is mounted on ball bearings 6, thereby causing Z table 3 to be tilted. However, the height of Z table 3 on Y table 2 is made higher only by the height of lift means 7 than that of Z table 3 on Y table 2 in the mechanism shown in FIG. 1. In addition, pitching error and the like are likely to be caused even in the table moving mechanism shown in FIG. 2 because of the reasons mentioned relating to the mechanism shown in FIG. 1.

The table moving mechanism which is intended to tilt Z table may be provided with three actuators 8, as shown in FIG. 3. Each of actuators 8 includes slider member 9 extended in the vertical direction and slidable in the same direction to lift Z table. When three actuators 8 are driven at the same time, Z table 3 is moved up and down in the vertical direction and when one of actuators 8 is driven, that face of Z table 3 on which the wafer or the like is mounted is tilted. However, it is needed that each of the actuators has slider member 9 which is extended and slidable in the vertical direction. The height of Z table 3 on Y table 2 is thus made relatively high.

Slider members 9 of the actuators in the table moving mechanism shown in FIG. 3 may be moved by feed screw means or piezo-electric elements. In the case where slider members 9 are moved by the feed screw means, their range in which they can move is large but they can move only roughly (or their resolution is low or bad). The movable range of Z table is thus made large but its resolution is low or bad and the accuracy of positioning it is low accordingly. This is the above-mentioned third problem.

In the other case where slider members 9 are moved by the piezo-electric elements, they can be moved extremely delicately (or their resolution is high or good), but their movable range is relatively small. Z table can be thus moved with high accuracy but its movable range is small. This is a fourth problem.

SUMMARY OF THE INVENTION

A first object of the present invention is to provide a table moving apparatus having a table movable along a line crossing a reference plane wherein the interval between the reference plane and the movable table can be made relatively short.

A second object of the present invention is to provide a table moving apparatus capable of restraining pitching and rolling errors of the movable table from being caused.

A third object of the present invention is to provide a table moving apparatus capable of making the resolution of the movable table so high or good as to position the movable table with high accuracy, however low or bad the resolution of that movement which is caused by a movable object to move the movable table may be.

A fourth object of the present invention is to provide a table moving apparatus capable of making the movable range of the movable table large, however small the movable range of that movement which is caused by a movable object to move the movable table may be.

According to the present invention, there is provided a table moving apparatus comprising:
a reference table having a reference plane;
a movable object movable along a first line to generate a driving force acting along the first line;
a changing member having a fulcrum supported by the reference table, and receiving the driving force to swing round the fulcrum and change the driving force to a second force acting along a second line crossing the reference plane; and
a movable table supported by the reference table and receiving the second force to move along the second line.

The table moving apparatus of the present invention makes it unnecessary to mount the bearing balls on the wedge-like blocks. In addition, it also makes it unnecessary to arrange the slider members extended and slidable between the reference plane and the moving table. Therefore, the interval between the reference plane and the moving table can be made shorter than those in the devices shown in FIGS. 1 through 3.

The changing member includes a lever member which has a first point to which the driving force is applied and a second point at which the second force is applied to the movable table. Lever member is supported rotatably round the fulcrum. When the first point receives the driving force, the first point moves along the first line and the lever member swings round the fulcrum to move the second point along the second line and apply the second force to the movable table, thereby causing the movable table to move along the second line.

The interval between the fulcrum and the first point or between the fulcrum and the second point can be changed and the ratio of the level member (or movement of the movable table/movement of the movable object) can be thus easily adjusted. Even if the ratio of the lever member is not set correct because error is made in the process of attaching the lever member, therefore, it can be easily corrected to an exact value. As the result, the movable table can be moved in accordance with the movement of the movable object.

When the plural lever members are employed by the table moving apparatus, for example, it sometimes happens that the ratio of one of the lever members is different form those of the other lever members because of the attaching error of this one lever member. Pitching error and the like are thus caused. According to the table moving apparatus of the present invention, however, the ratio of the lever member can be easily adjusted and those of all of the lever members can be easily set same accordingly. The possibility of causing the pitching error and the like can be thus made low.

When the ratio is of the reduction type, the movement of the movable object is reduced, and the movement of the movable table is proportionally reduced. Even when the resolution of the movement of the movable table is low or bad, therefore, the resolution of the movement of the movable table can be thus made high or good. As the result, the movable table can be positioned with high accuracy. The range of the movement of the movable object is also reduced this time by the lever member and the movable range of the movable table may be thus made smaller than in the case where no lever member is used. As will be described relating to the preferred embodiments of the present invention, however, it causes no practical disadvantage that the range of the movement of the movable object is reduced by the lever member.

When the ratio is of the enlargement type, the movement of the movable object is enlarged and the movement of the movable table is proportionally enlarged. Even when the range of the movement of the movable object is small, therefore, the range of the movement of the movable table can be thus made large. The resolution of the movement of the movable object is enlarged this time by the lever member. Therefore, the resolution of the movable table may be made lower or worse than in the case where no lever member is used. As will be described relating to the preferred embodiments of the present invention, however, no practical disadvantage is caused even if the resolution of the movement of the movable object is enlarged by the lever member.

BRIEF DESCRIPTION OF THE DRAWINGS

FIGS. 4 and 5 show a first embodiment of the table moving apparatus according to the present invention, in which FIG. 4 is a perspective view showing the apparatus partly dismantled and FIG. 5 is a sectional view showing the apparatus.

FIGS. 9 and 10 show a third embodiment of the table moving apparatus according to the present invention, in which FIG. 9 is a perspective view showing the apparatus partly dismantled and FIG. 10 is a sectional view showing the device.

FIGS. 11 and 12 show a fourth embodiment of the table moving apparatus according to the present invention, in which FIG. 11 is a perspective view and FIG. 12 a sectional view.

FIG. 13 is a perspective view showing a fifth embodiment of the table moving apparatus according to the present invention, said apparatus being shown dismantled.

FIGS. 14 through 16 are intended to explain a first variation of the lever member, in which FIG. 14 is a front view showing the lever member employed by the first through fifth embodiments, FIG. 15 a front view showing the first variation of this lever member, and FIG. 16 shows speed components at an acting or second point of the lever member.

DETAILED DESCRIPTION OF THE PREFERRED EMBODIMENTS

Figure 4:
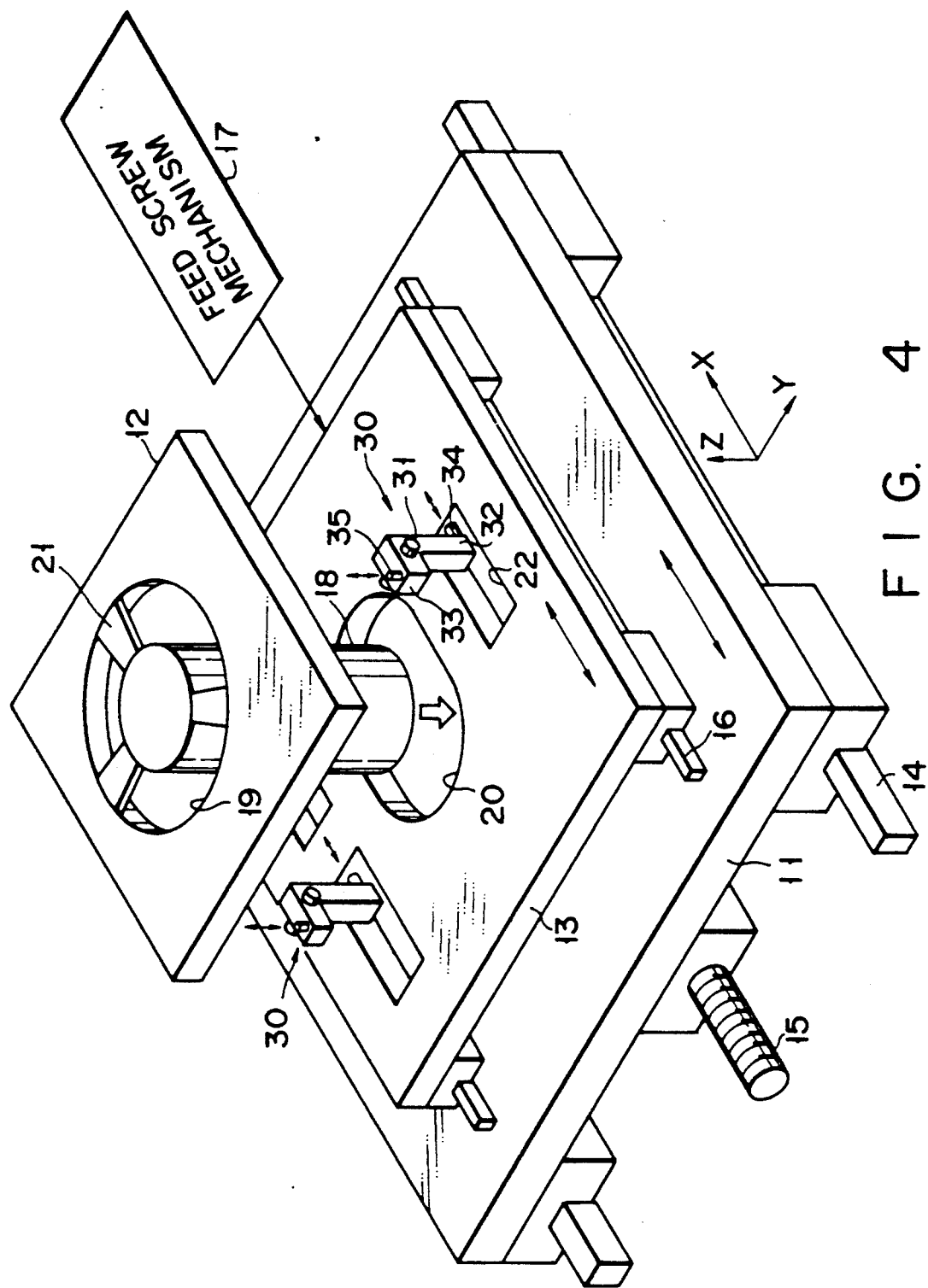
Figure 5:
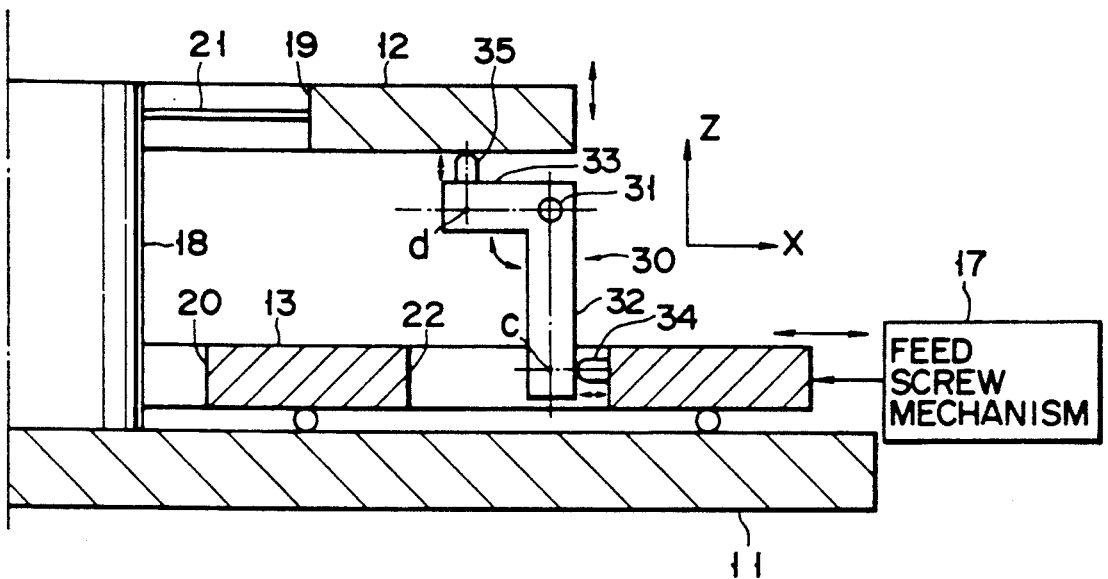

FIGS. 4 and 5 show a first embodiment of the table moving apparatus according to the present invention. The table moving apparatus is provided with reference or X table 11 having a reference plane held horizontal and movable in the horizontal direction (or direction X). This table may be arranged to move in direction Y. Z table 12 having a plane, held horizontal and movable in the vertical direction (or direction Z), on which some object is mounted is arranged above X table 11. A table (not shown) chucking a wafer is mounted on the object-mounted plane of Z table. Sub-table 13 is mounted on the reference plane of X table 11. This sub-table 13 moves in direction X to move Z table 12 in direction Z, as will be described later.

X table 11 is guided along linear guides 14 extended in direction X and it is moved in direction X by feed screw mechanism 15. Sub-table 13 is guided along linear guides 16 extended in direction X on X table 11 and it is moved in direction x by feed screw mechanism 17.

Column 18 is erected on the reference plane of X table 11. Z table 12 and sub-table 13 has through-holes 19 and 20 through which column 18 is passed. One end of each of three plate springs 21 is attached to the upper end of column 18, while the other end thereof is attached to the inner circumference of through-hole 19 in Z table 12. Z table 12 is thus supported by column 18 through plate springs 21 and when plate springs 21 deform elastically, Z table 12 can move in direction Z.

The table moving apparatus according to the present invention has three lever members 30 (two of them are seen in FIG. 4 but the other one is not seen because it is behind column 18) for changing a driving force of sub-table 13 in direction X to a force in direction Z, thereby causing Z table 12 to move in direction Z.

Lever member 30 has rod 31 which serves as a fulcrum, and it can swing round this rod 31. Rod 31 is supported swingable by a member (not shown) on X table 11. Lever member 30 has first arm 32 extended from the position of rod 31 in the vertical direction and inserted into rectangular hole 22 of sub-table 13, and second arm 33 extended from the position of rod 31 in the horizontal direction. First projection 34 is arranged on the inner face of rectangular hole 22 in sub-table 13 and contacted with first arm 32 at the foremost end thereof. The foremost end of first projection 34 serves as a first point (or pushed point) to which the driving force of sub-table 13 in direction X is applied. Second projection 35 is arranged on the upper face of second arm 33 and contacted with the underside of Z table 12 at the foremost end thereof. The foremost end of second projection 35 serves as a second point (of pushing point) for applying the force in direction Z to Z table.

The underside of Z table 12 urges second projection 35 downward due to the elasticity of plate springs 21. The position of first projection 34 which is attached to the inner face of hole 22 in sub-table 13 can be changed in direction Z. The position of second projection 35 which is attached to second arm 33 can be changed in direction X.

When sub-table 13 is moved in direction X (or in left direction in FIG. 5), first projections 34 of sub-table 13 push first arms (or pushed points) 32 of lever members 30. Each of lever member 30 is thus swung clockwise round rod (or fulcrum) 31. As the result, second projections (or pushing points) 35 on second arms 33 of lever members 30 push the underside of Z table 12. Z table 12 is thus moved upward in direction Z against the elasticity of plate springs 21. When sub-table 13 is moved in right direction in FIG. 5, Z table 12 is moved downward in direction Z by plate springs 21 and each of lever members 30 is swing anti-clockwise round rod (or fulcrum) 31.

Figure 1:
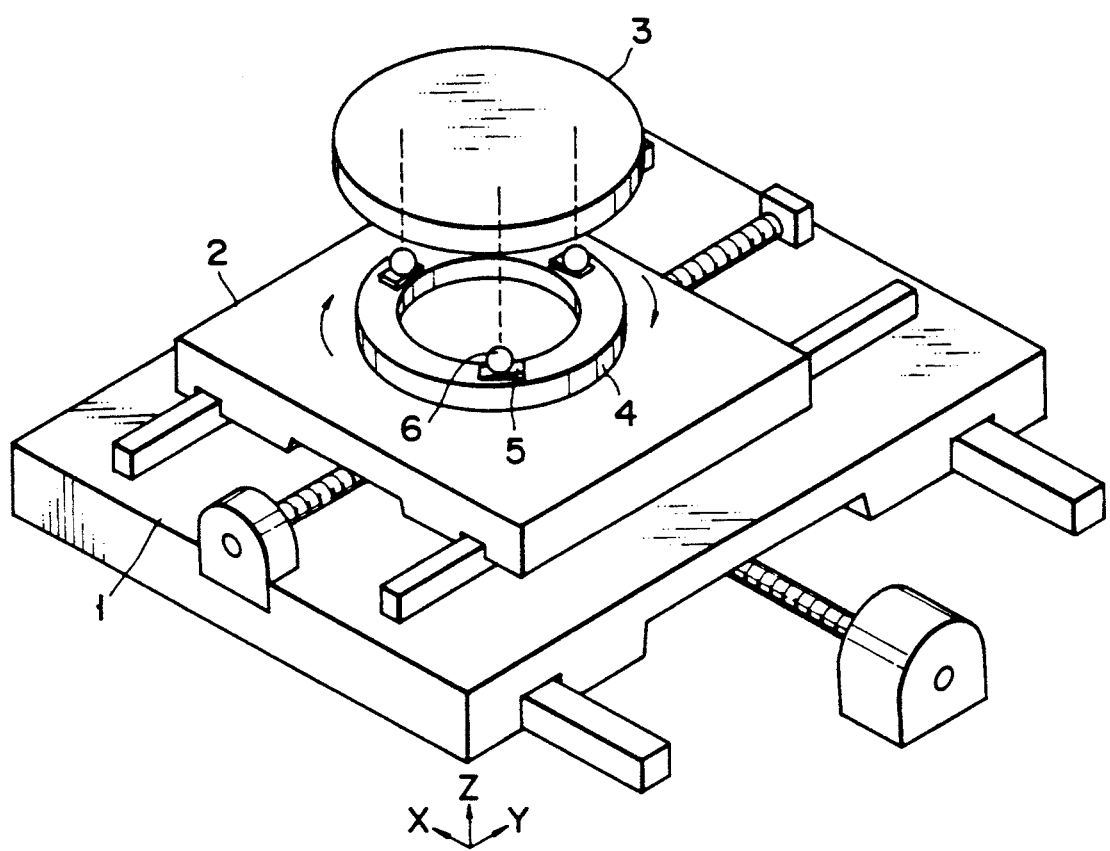
FIG. 1 is a perspective view showing the conventional Z table moving mechanism intended to move Z table in the vertical direction.
Figure 2:
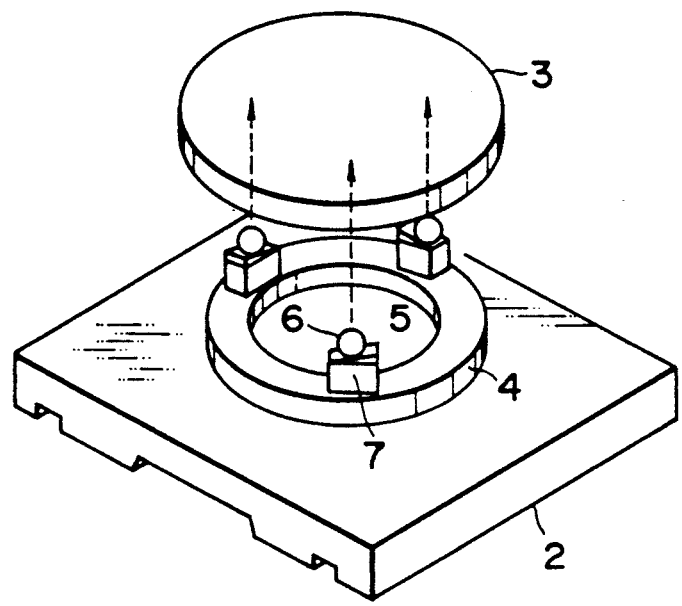
FIGS. 2 and 3 are perspective views showing the conventional table moving mechanisms intended to tilt Z table.

The first embodiment of the present invention makes it unnecessary to arrange the bearing balls on the wedge-like blocks, as shown in FIGS. 1 and 2. In addition, it also makes it unnecessary to arrange slider members, extended and slidable, between X and Z tables. The height of Z table relative to X table can be made lower than in the mechanisms shown in FIGS. 1 through 3.

Z table is moved by three lever members and the object-mounted plane of Z table can be thus held exactly horizontal. Further, the sub-table applies the driving force in direction X to the three lever members at the same time. Therefore, the pitching error and the like are more difficultly caused than in the case where the driving force in direction X is applied to the lever member independently of the other two.

Figure 6:
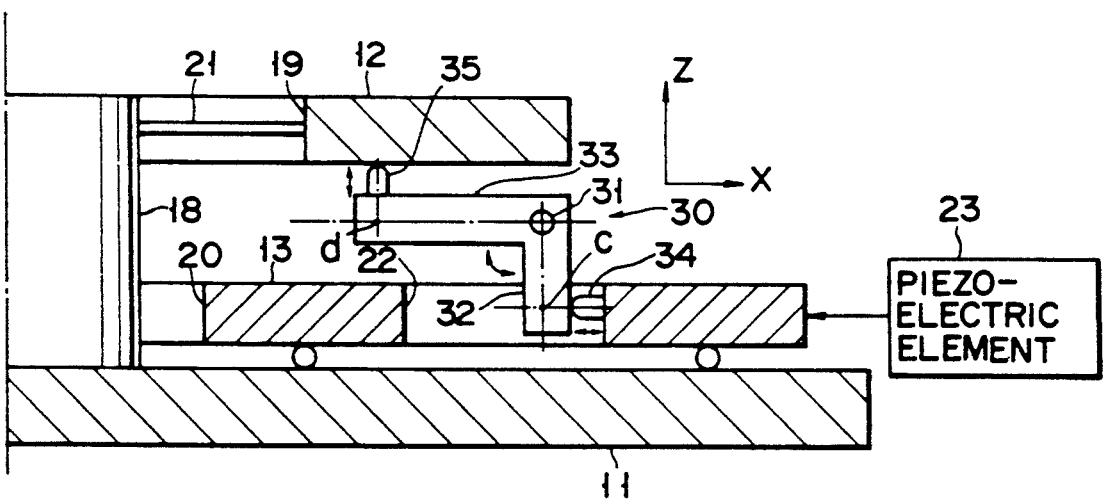
FIG. 6 is a sectional view showing a first variation of the first table moving apparatus according to the present invention.

As shown in FIGS. 5 and 6, the ratio between interval (a) from the fulcrum to the first point (or pushed point) and interval (b) from the fulcrum to the second point (or pushing point) usually determines the ratio of the lever member (or movement of Z table/movement of sub-table). More strictly speaking, the lever member includes: a first crossing point (c) where a line passing through the first point and extending in direction X crosses a plane perpendicular to this line and passing through the fulcrum; and a second crossing point (d) where a line passing through the second point and extending in direction Z crosses a plane perpendicular to this line and passing through the fulcrum. The ratio of interval (e) between first crossing point (c) and the fulcrum and interval (f) between second crossing point (d) and the fulcrum determines the ratio of the lever member.

This ratio can be easily adjusted by changing the positions of first and second projections 34 and 35 attached. Even when the ratio of the lever member is not set correct because of the attaching error of the lever member, therefore, it can be easily corrected to an exact value. Therefore, Z table can be moved in accordance with the movement of the sub-table.

When the ratio of one of the lever members is set different from those of the other two, the pitching error and the like are caused. However, the ratio of the lever member can be easily adjusted and those of all of the lever members can be thus easily set same. Z table can be therefore moved up and down, keeping its object-mounted plane horizontal, so that the possibility that the pitching error and the like are caused can be made low.

When a>b, more strictly, e>f, as shown in FIG. 5, the ratio of the lever member is of the reduction type. Therefore, the movement of the sub-table is reduced and the movement of Z table is proportionally reduced. Even when the resolution of the sub-table is low or bad, therefore, the resolution of Z table is made high and good and the positioning of Z table can be thus achieved with high accuracy.

When the ratio is of the reduction type, feed screw mechanism 17 is used to move the sub-table. Feed screw mechanism 17 includes a motor, a feed screw, and a slider member slide by the feed screw in the axial direction thereof. When the slider member is moved in direction X, the sub-table is moved in direction X. The resolution of this slider member is usually low or bad, but the resolution of Z table can be made high or good.

The movable range of the slider member is reduced by the lever members in this case. The movable range of Z table may be made smaller, accordingly, than in the case where no lever member is used. However, feed screw mechanism 17 can usually move the slider member in an extremely large range. Although it may be made reduced a little, the movable range of Z table is not made so small as to cause practical disadvantages. Therefore, it provides no practical disadvantage that the movable range of the slider member is reduced by the lever members.

When the ratio is of the reduction type, a piezo-electric element whose resolution is extremely high or good may be used to move the sub-table. The resolution of Z table can be made extremely high or good in this case.

FIG. 6 shows a first variation of the first table moving apparatus according to the present invention. When a<b, more strictly, e<f, as shown in FIG. 6, the ratio of the lever member is of the enlargement type and the movement of the sub-table is enlarged and the movement of Z table is proportionally enlarged. Even when the movable range of the sub-table is small, therefore, that of Z table can be made large.

When the ratio is of the enlargement type, piezo-electric element 23 is used to move the sub-table. The piezoelectric element cannot usually move the sub-table over a long distance. As described above, however, the movable distance of Z table can be made long even if the movable range of the sub-table is small.

The resolution of the sub-table is also enlarged by the lever members in this case. Therefore, the resolution of Z table may be made lower or bad than in the case where no lever member is used. However, the piezo-electric element can move the sub-table in a high resolution. Even if it might be thus made little low or bad, the resolution of Z table cannot be made so low or bad as to cause practical disadvantages. It provides no practical disadvantage, therefore, that the resolution of the sub-table is enlarged by the lever members.

Figure 7:
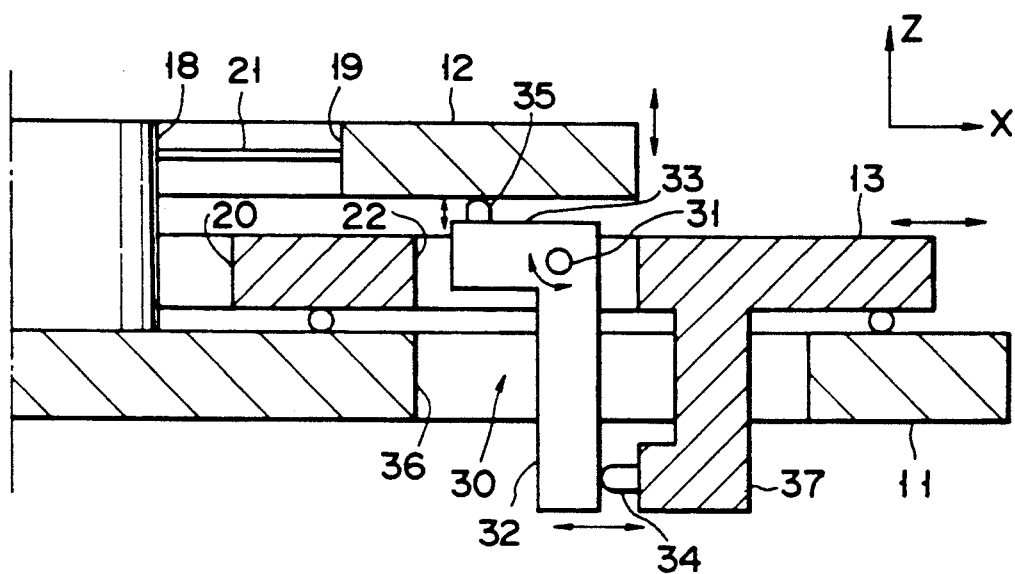
FIG. 7 is a sectional view showing a second variation of the first table moving apparatus according to the present invention.

FIG. 7 shows a second variation of the first table moving apparatus according to the present invention. The first point (or pushed point) at which sub-table 13 acts on the lever member is located under X table in this case. Namely, through-hole 36 is formed in X table. Arm 37 extending downward from sub-table 13 passes through through-hole 36. First projection 34 is arranged on the lower end portion of arm 37 and contacted with first arm 32 at the foremost end thereof to define the first point (or pushed point).

The first point (or pushed point) is located under X table in this second variation. Thus, the height of Z table relative to X table can be thus made lower than in the case of the first embodiment shown in FIGS. 4 and 5.

Figure 8:
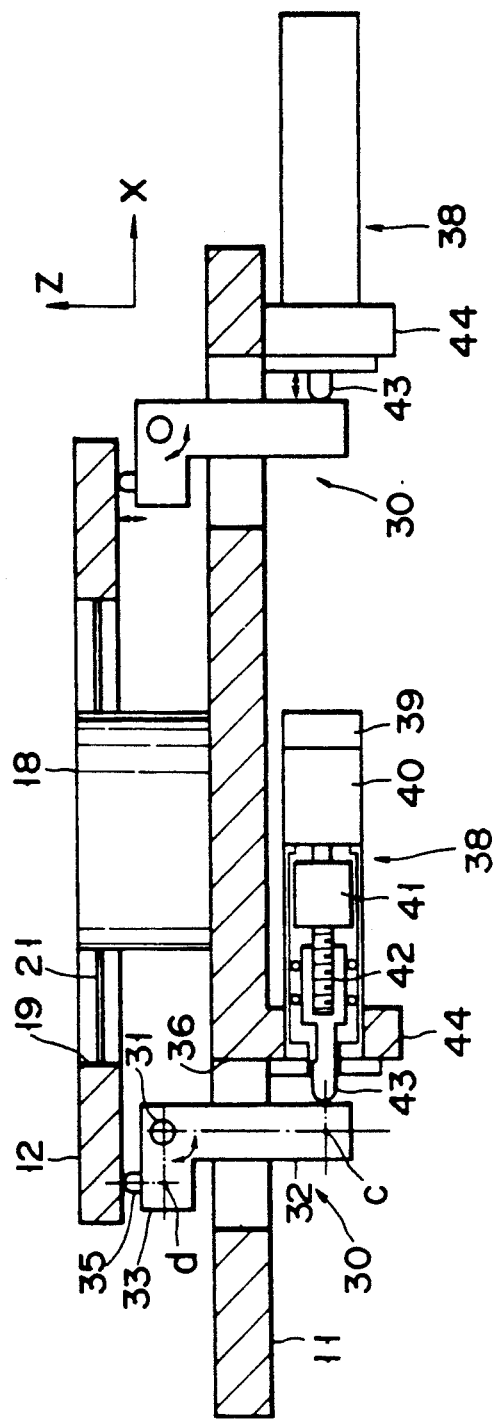
FIG. 8 is a sectional view showing a second embodiment of the table moving apparatus according to the present invention.

FIG. 8 shows a second embodiment of the table moving apparatus according to the present invention. The Z table moving apparatus is intended to tilt Z table as well as move it up and down. When Z table is tilted, the object-mounted plane of Z table which has been incorrectly tilted can be corrected.

First arm 32 of lever member 30 is extended downward, passing through through-hole 36 of X table 11. Three actuators 38 (two lever members and actuators are shown in FIG. 8 but the remaining ones are not shown) for applying the driving force to their respective three lever members are attached to arms 44 extended downward from X table 11. Actuator 38 is a feed screw mechanism. Namely, actuator 38 includes encoder 39, motor 40, speed reducer 41, feed screw 42 connected to the rotation shaft of speed reducer 41, and slider member 43 slided by feed screw in direction X. The foremost end of slider member 43 strikes against the first arm of the lever member to define the first point (or pushed point).

When three actuators 38 are driven at the same time, therefore, each of the lever members applies the driving force of each of slider members 43 of actuators 38 to Z table 12 to move it up and down.

When one of actuators 38 is driven, its corresponding lever member applies the driving force of slider member 43 to Z table 12. As the result, Z table 12 is moved up or down at one point thereof and it is tilted accordingly.

The ratio (e:f) of interval 'e' between the fulcrum of the lever member and the first crossing point (c) and interval (f) between the fulcrum and the second crossing point (d) is set 1:3 in this second table moving apparatus. The resolution and movable range of Z table can be set most appropriately in this case from the viewpoint of practical use. Therefore, the second table moving apparatus is more advantageous than the table moving mechanism shown in FIG. 3 in that the resolution of Z table can be made higher or better than that of the mechanism shown in FIG. 3.

The actuator may be a piezoelectric element. The resolution of Z table can be made extremely high or good in this case. Further, the ratio of the lever member may be set to be of the enlargement type.

Figure 9:
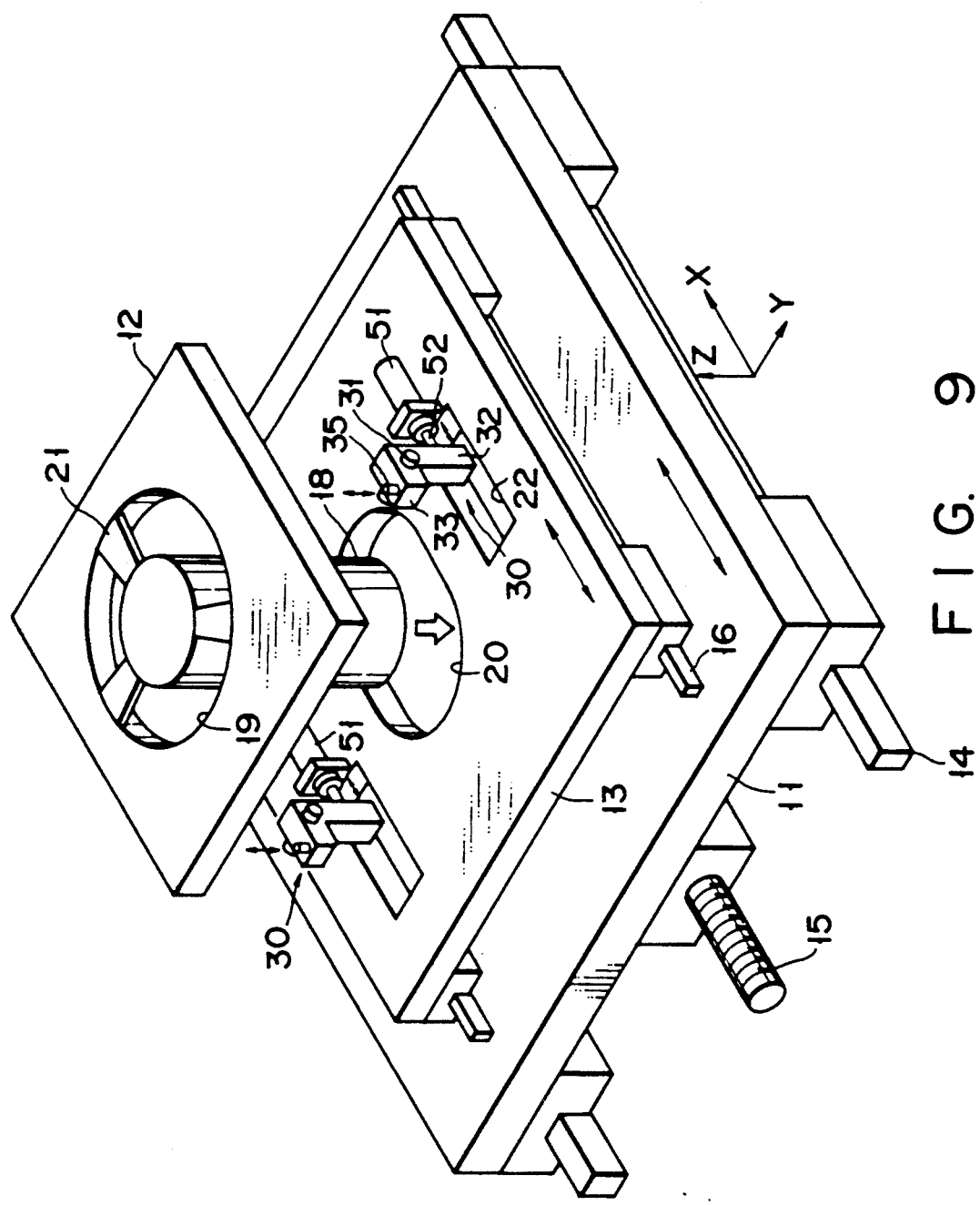
Figure 10:
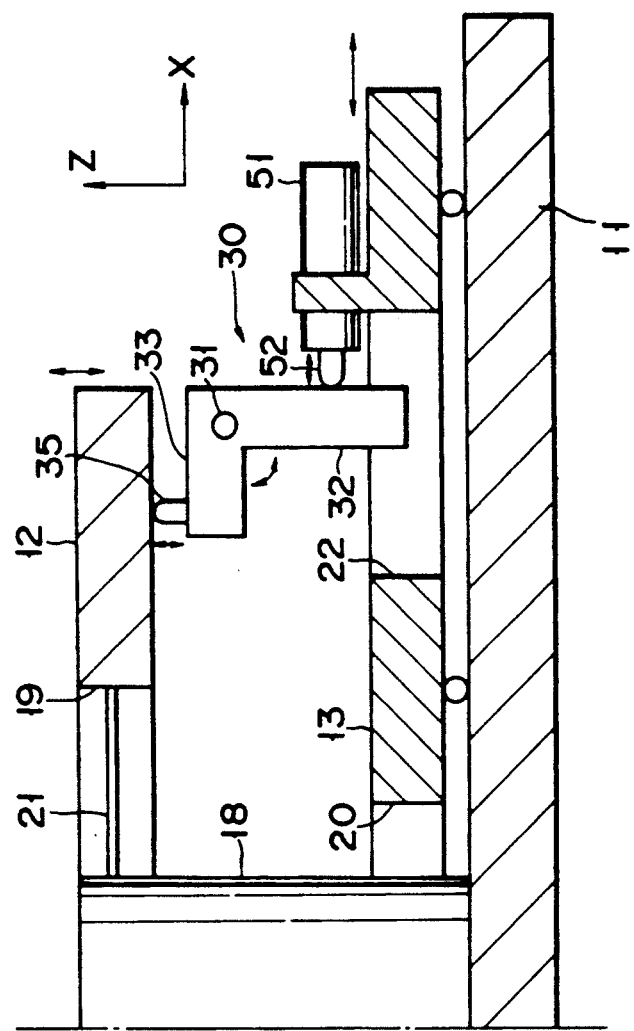

FIGS. 9 and 10 show a third embodiment of the table moving apparatus according to the present invention. This third table moving apparatus is of the type to tilt Z table.

The third table moving apparatus is almost similar to the first one but different from the latter in that the actuators are arranged on the sub-table. Each of actuators 51 is arranged on sub-table 13 to apply the driving force movement to each of lever members 30. The foremost end of each of slider members 52 for actuators 51 strokes against first arm 32 of each of lever members 30 to define the first point (or pushed point). Actuator 51 may be a feed screw mechanism or piezo-electric element.

When sub-table 12 is moved in direction X, therefore, the driving force of the sub-table is applied to the three lever members at the same time and the three lever members applies the force to Z table to thereby move it up and down. When one of the actuators 51 is driven, Z table can be tilted.

Figure 3:
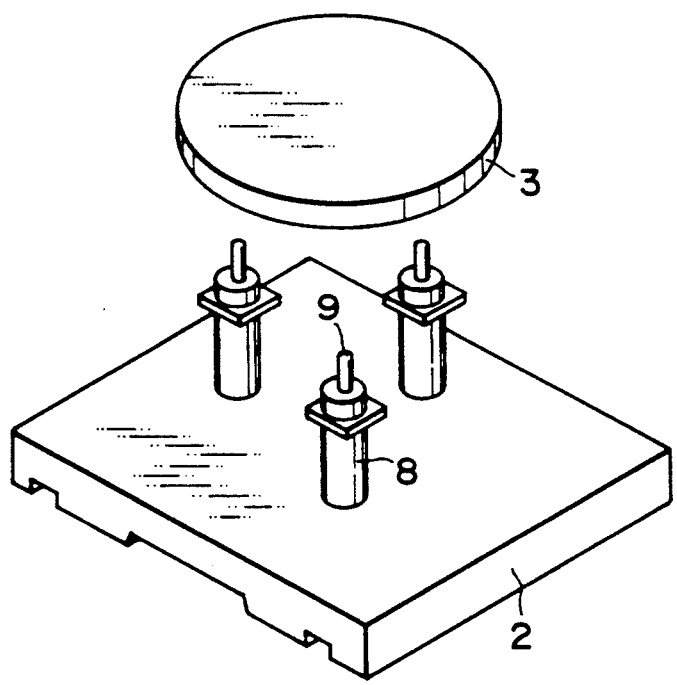

Both of this third table moving apparatus and the one shown in FIG. 3 are of the type to tilt Z table as well as move it up and down. However, both are different from the other in that the three actuators serve to tilt Z table as well as to move it up and down in the mechanism shown in FIG. 3 while the sub-table serves to move it up and down and the actuators serve to tilt it in the third table moving apparatus. When it is moved up and down in the mechanism shown in FIG. 3, therefore, it is needed that three actuators 8 are driven at the same time and that slider members 9 are moved over same distance. However, it is difficult to control three actuators 8 in this manner. The pitching error and the like are likely to be caused accordingly. On the contrary, the force of the sub-table is applied to the three lever members at the same time to move Z table up and down in the case of the third table moving apparatus. Therefore, control necessary to move Z table up and down can be easily made and the possibility that the pitching error and the like are caused can be made low accordingly.

Further, the ratio of the lever member is of the reduction type in the third table moving apparatus. Therefore, the third table moving apparatus is thus more advantageous than the mechanism shown in FIG. 3 in that the pitching error is more difficultly caused and that the resolution of Z table is better.

When actuator 51 is a piezoelectric element whose resolution is high or good, the sub-table can move Z table roughly while the actuators can move it delicately.

Figure 11:
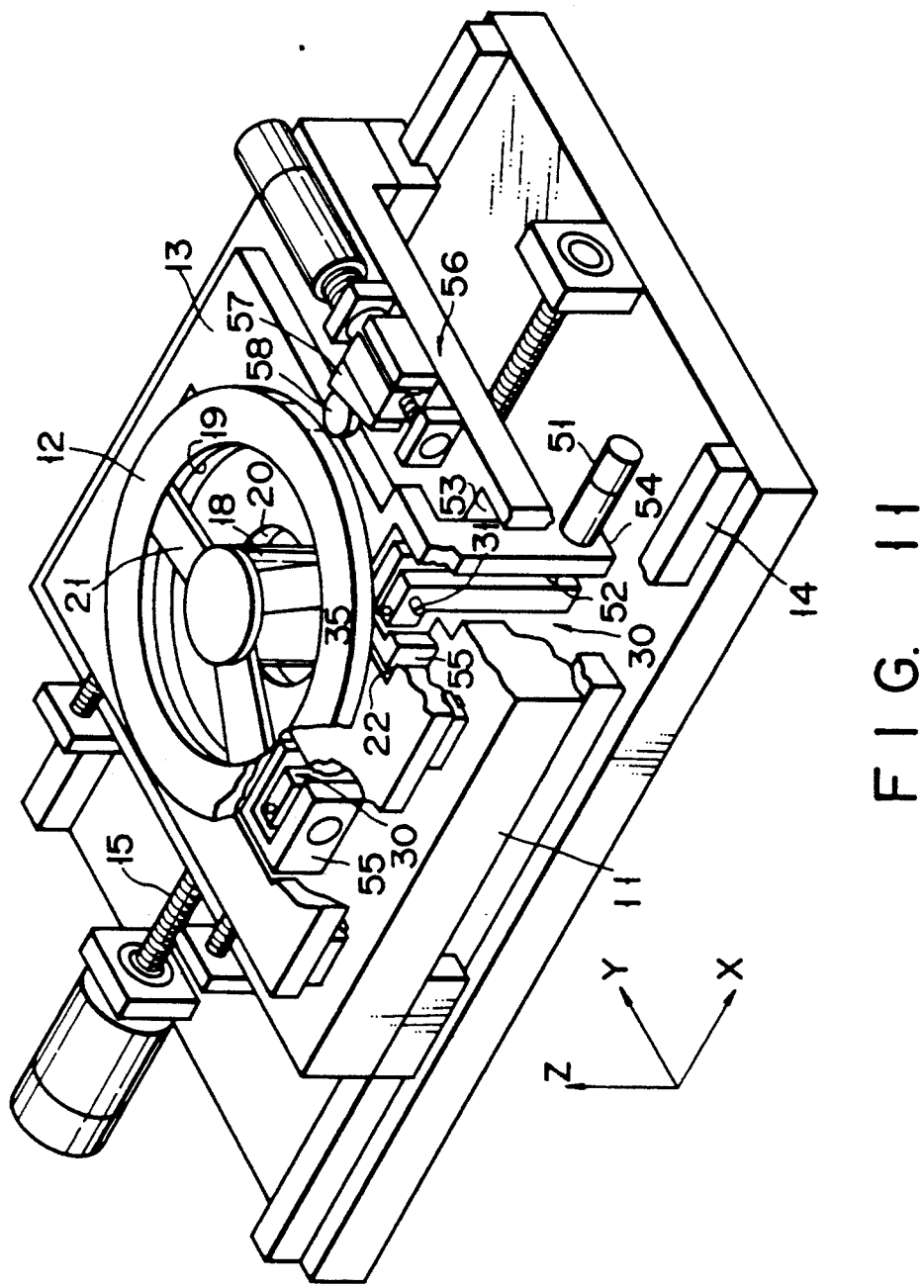
Figure 12:
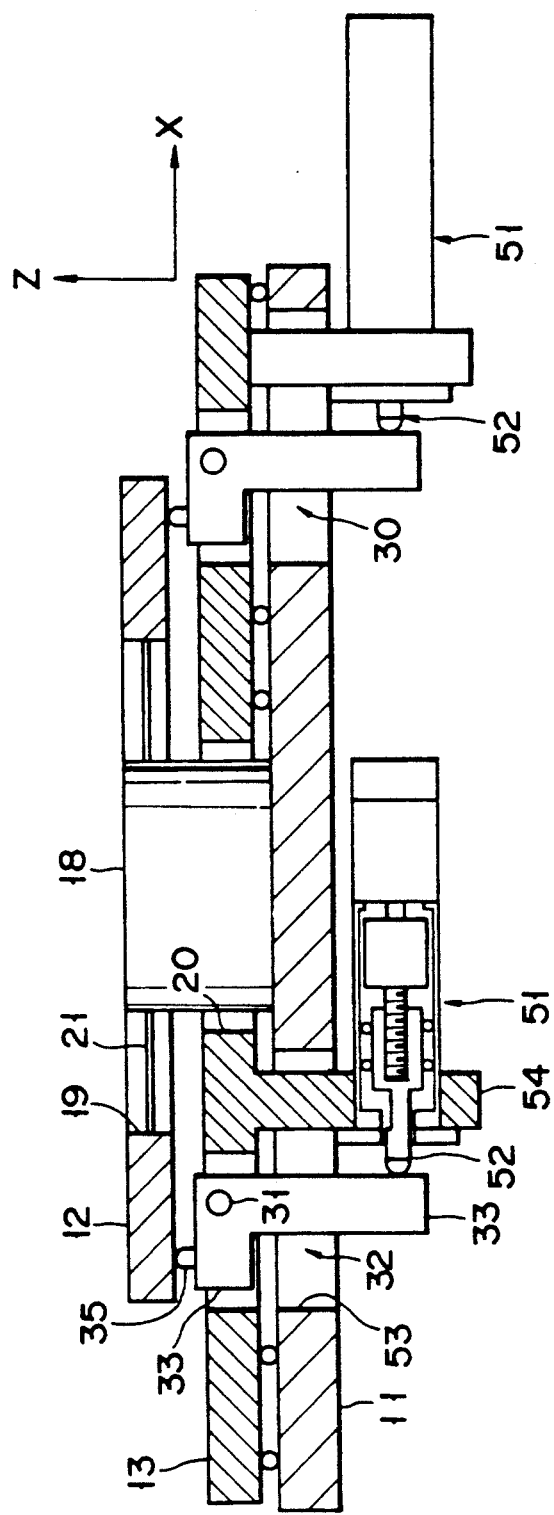

FIGS. 11 and 12 show a fourth embodiment of the table moving apparatus according to the present invention. This fourth table moving apparatus is different from the third one in that the forced point or first point of each of the lever members is located under X table. The height of Z table relative to X table can be thus made lower in the fourth table moving apparatus than in the third one. Through-holes 53 are formed in X table. Arm 54 extending downward from sub-table 13 is passed through each of through-holes 53. Actuator 51 is attached to the lower end of arm 54. The foremost end of slider member 52 of this actuator strikes against second arm 33 to define the first point (or pushed point).

FIG. 11 shows that the fulcrum of each of lever members 30 is supported by X table through bracket 55. Further, mechanism 56 for moving sub-table 13 is shown in FIG. 11. Mechanism 56 moves sub-table 13 in direction X by moving wedge-like block 57 in direction Y and sliding bearing ball 58 on the tapered face of wedge-like block 57.

FIG. 13 shows a fifth embodiment of the table moving apparatus according to the present invention. This fifth embodiment is provided with table or θ table 61 which rotates round axial line Z. Lever members 30 are arranged on the outer circumference of θ table 61 at a certain interval. First projection 34 is projected outward from the outer circumference of θ table 61 and contacted with first arm 32 of each of the lever members. When θ table 61 rotates, therefore, first projections 34 push first arms 32 and lever members 30 are thus swung to move Z table 12 up and down.

FIGS. 14 through 16 are intended to explain a first variation of the lever member. The second point (or pushing point) is located higher than second crossing point (d) in the case of the lever member shown in FIG. 14. When the force of the sub-table is applied to the lever member to swing it, for example, moving components at the second point include those in directions Z and X, as shown in FIG. 16. This makes it impossible that the movement of the Z table is proportional to the movement of the sub-table. On the contrary, the second point (or pushing point) is located at a same height as second crossing point (d) in the case of the lever member shown in FIG. 15. Therefore, only the moving component in direction Z exists at the second point, as shown in FIG. 16. This makes it possible that the movement of the Z table is proportional to the movement of the sub-table. It is therefore preferable that the second point of the lever member is positioned same high as second crossing point (d). Same thing can be said about the first point (or pushed point).

Figure 17:
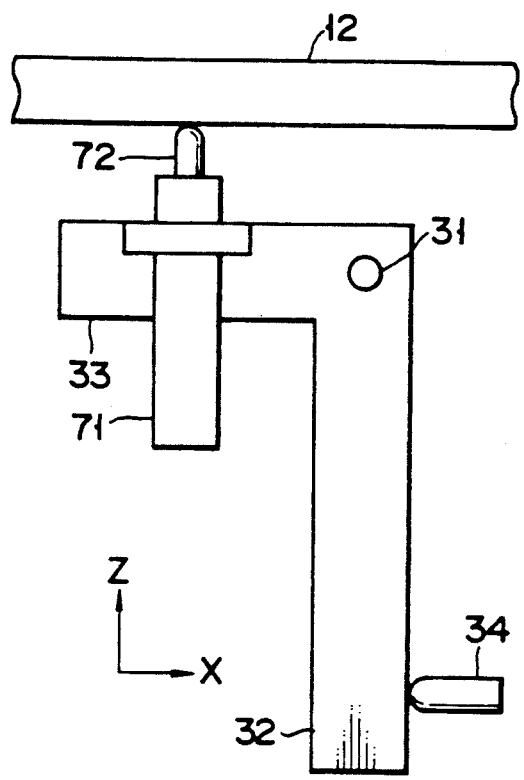
FIG. 17 is a front view showing a second variation of the lever member.

FIG. 17 shows a second variation of the lever member. Actuator 71 is attached to second arm 33 of the lever member. The foremost end of slider member 72 of actuator 71 strokes against the underside of Z table 12 to define the second point (or pushing point).

Z table is moved by the actuator at one point thereof and it is tilted accordingly in this case. When actuator 71 is a piezoelectric element, Z table is extremely delicately moved by the actuator.

Figure 18:
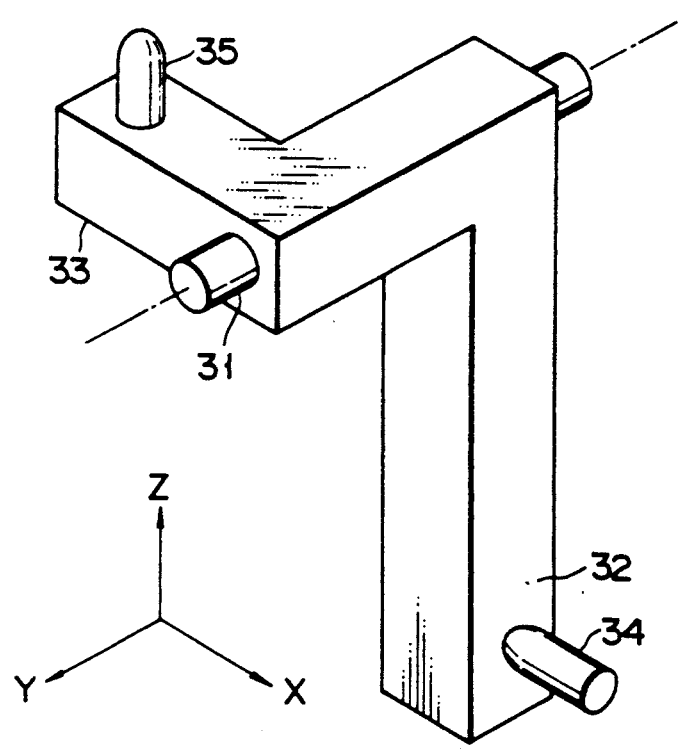
FIG. 18 is a perspective view showing a third variation of the lever member.

FIG. 18 shows a third variation of the lever member. The first and second points (or pushing and pushed points) are positioned on plane Z—X in the above-described embodiments, but they may be shifted from each other in direction Y, as seen in FIG. 18.

It should be understood that the present invention is not limited to the above-described embodiments. It should also be understood that the table which is moved by the table moving apparatus of the present invention is not limited to Z table which is moved in the vertical direction. The table may be moved in a line crossing to the reference plane.

What is claimed is:

1. A table moving apparatus comprising:
   a reference table having a reference plane;
   an actuator movable in a first direction parallel to the reference plane to generate a driving force acting in the first direction, said actuator coupled to a drive source for moving said actuator to generate the driving force;
   a lever member, having a fulcrum supported by the reference table, a first point to which the actuator is applied and a second point at which a second force is generated, said lever member receiving at the first point the driving force from said actuator, said lever member pivoting about the fulcrum in response to the reception of the driving force from said actuator at the first point to generate at the second point the second force acting in a second direction perpendicular to the reference plane, said first and second points located on said lever member such that upon pivoting of said lever member about said fulcrum said first and second points each move respective movement distances, and wherein said first and second points are located on said lever member such that movement distances of said first point have a linear relationship to corresponding movement distances of said second point during pivoting of said lever member about said fulcrum; and a movable table, supported by the reference table, for receiving the second force from the second point of said lever member to cause movement of the movable table in the second direction, thereby positioning said movable table with respect to said reference table;

wherein an interval between the fulcrum and the first point is made longer than that between the fulcrum and the second point.

2. The table moving apparatus according to claim 1 wherein the lever member includes a first crossing point, where a first line extending substantially in the first direction and passing through the first point crosses a first plane perpendicular to the first line and said first plane passes through the fulcrum; and a second crossing point, where a second line extending substantially in the second direction and passing through the second point crosses a second plane perpendicular to the second line and said second plane passes through the fulcrum.

3. The table moving apparatus according to claim 2 wherein the first and second points are corresponded with the first and second crossing points, respectively.

4. The table moving apparatus according to claim 1 wherein the lever member has another actuator for applying the second force from the second point to said movable table.

5. The table moving apparatus according to claim 1 wherein the first and second points of the lever member are shifted from each other in a direction extending along the rotating axial line of the fulcrum.

6. A table moving apparatus comprising:

a reference table having a reference plane;

an actuator movable in a first direction parallel to the reference plane to generate a driving force acting in the first direction, said actuator coupled to a drive source for moving said actuator to generate the driving force;

a lever member, having a fulcrum supported by the reference table, a first point to which the actuator is applied and a second point at which a second force is generated, said lever member receiving at the first point the driving force from said actuator, said lever member pivoting about the fulcrum in response to the reception of the driving force from said actuator at the first point to generate at the second point the second force acting in a second direction perpendicular to the reference plane, said first and second points located on said lever member such that upon pivoting of said lever member about said fulcrum said first and second points each move respective movement distances, and wherein said first and second points are located on said lever member such that movement distances of said first point have a linear relationship to corresponding movement distances of said second point during pivoting of said lever member about said fulcrum; and a movable table, supported by the reference table, for receiving the second force from the second point of said lever member to cause movement of the movable table in the second direction, thereby positioning said movable table with respect to said reference table;

wherein the first point of the lever member is located on one side of the reference plane and the second point thereof and the movable table are located on the other side of the reference plane.

7. A table moving apparatus comprising:

a reference table having a reference plane;

an actuator movable in a first direction parallel to the reference plane to generate a driving force acting in the first direction, said actuator coupled to a drive source for moving said actuator to generate the driving force;

a lever member, having a fulcrum supported by the reference table, a first point to which the actuator is applied and a second point at which a second force is generated, said lever member receiving at the first point the driving force from said actuator, said lever member pivoting about the fulcrum in response to the reception of the driving force from said actuator at the first point to generate at the second point the second force acting in a second direction perpendicular to the reference plane, said first and second points located on said lever member such that upon pivoting of said lever member about said fulcrum said first and second points each move respective movement distances, and wherein said first and second points are located on said lever member such that movement distances of said first point have a linear relationship to corresponding movement distances of said second point during pivoting of said lever member about said fulcrum; and a movable table, supported by the reference table, for receiving the second force from the second point of said lever member to cause movement of the movable table in the second direction, thereby positioning said movable table with respect to said reference table;

wherein said movable table is supported on the reference table by an elastic member such that said reference table is urged by the elastic member along the second line and toward the second point of the lever member.

8. A table moving apparatus comprising:

a reference table having a reference plane;

an actuator movable in a first direction parallel to the reference plane to generate a driving force acting in the first direction, said actuator coupled to a drive source for moving said actuator to generate the driving force;

a lever member, having a fulcrum supported by the reference table, a first point to which the actuator is applied and a second point at which a second force is generated, said lever member receiving at the first point the driving force from said actuator, said lever member pivoting about the fulcrum in response to the reception of the driving force from said actuator at the first point to generate at the second point the second force acting in a second direction perpendicular to the reference plane, said first and second points located on said lever member such that upon pivoting of said lever member about said fulcrum said first and second points each move respective movement distances, and wherein said first and second points are located on said lever member such that movement distances of said first point have a linear relationship to corresponding movement distances of said second point during pivoting of said lever member about said fulcrum; and a movable table, supported by the reference table, for receiving the second force from the second point of said lever member to cause movement of the movable table in the second direction, thereby positioning said movable table with respect to said reference table;

the table moving apparatus further including at least three lever members and the second points on these lever members are separated from one another.

9. The table moving apparatus according to claim 8 wherein said actuator includes means for applying the driving force to the three lever members at the same time.

10. The table moving apparatus according to claim 9 wherein the applying means have a sub-table supported by said reference table and movable so that the sub-table applies the driving force to the first points at the same time.

11. The table moving apparatus according to claim 10 wherein the first points of the lever members are located on one side of the reference plane and the second points thereof and the movable table are located on the other side of the reference plane.

12. The table moving apparatus according to claim 8 wherein a plurality of actuators are provided supported by said reference table and serving to apply the driving force to the first points respectively.

13. The table moving apparatus according to claim 12 wherein the first points of the lever members and the actuators are located on one side of the reference plane and the second points thereof and the movable table are located on the other side of the reference plane.

14. The table moving apparatus according to claim 8 further including: a sub-table supported by said reference table and movable in the first direction and a plurality of said actuators supported by the sub-table and serving to apply the driving force to the first points, and when the actuators are left inoperative, the sub-table applies the driving force to the first points at the same time.

15. The table moving apparatus according to claim 14 wherein the first points of the lever members and actuators are located on one side of the reference plane and the second points of the lever member and the movable table are located on the other side of the reference plane.

16. The table moving apparatus according to claim 8 wherein said actuator includes a rotatable table supported by the reference table and movable about an axis which is substantially parallel to the second direction, wherein the driving force provided in the first direction is tangent to and provided by circumferential movement of the rotatable table such that when the rotatable table is rotated, the rotatable table applies the driving force to the first points at the same time.

* * * * *